(12) United States Patent
Tsunemine et al.

(10) Patent No.: US 6,501,113 B2
(45) Date of Patent: Dec. 31, 2002

(54) SEMICONDUCTOR DEVICE WITH CAPACITOR USING HIGH DIELECTRIC CONSTANT FILM OR FERROELECTRIC FILM

(75) Inventors: Yoshikazu Tsunemine, Tokyo (JP); Yasutoshi Okuno, Kyoto (JP)

(73) Assignees: Mitsubishi Denki Kabushiki Kaisha, Tokyo (JP); Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/897,038

(22) Filed: Jul. 3, 2001

(65) Prior Publication Data
US 2002/0074661 A1 Jun. 20, 2002

(30) Foreign Application Priority Data
Dec. 20, 2000 (JP) ........................................ 2000-386673

(51) Int. Cl.[7] .............................................. H01L 29/76
(52) U.S. Cl. ......................... 257/295; 257/296; 257/306
(58) Field of Search ................................. 257/295, 296, 257/306

(56) References Cited
U.S. PATENT DOCUMENTS 5,382,817 A      1/1995  Kashihara et al. ........... 257/295
5,767,541 A  *   6/1998  Hanagasaki ................. 257/295
6,078,072 A  *   6/2000  Okudaira et al. ............ 257/295
6,150,183 A  *  11/2000  Fukuda et al. .................. 438/3
6,359,295 B2 *   3/2002  Lee et al. .................... 257/295

FOREIGN PATENT DOCUMENTS
JP          10-256503           9/1998

* cited by examiner

Primary Examiner—T. N. Quach
(74) Attorney, Agent, or Firm—Oblon, Spivak, McClelland, Maier & Neustadt, P.C.

(57) ABSTRACT

A semiconductor device including a semiconductor substrate having a main surface, an insulating layer formed on the main surface of the semiconductor substrate, and lower electrode film embedded in the insulating layer. A dielectric film embedded in the insulating layer covers the lower electrode film. An upper electrode film is embedded in the insulating layer and is opposed to the lower electrode film through the dielectric film. A conductor plug electrically connects the lower electrode film and the semiconductor substrate with each other through a lower contact hole selectively formed in the insulating layer. A conductor layer is embedded in the insulating layer and is electrically connected to the upper electrode film on a first portion defining a part of the upper surface of the conductor layer. A wire arranged on the insulating layer is connected to a second portion defining another part, different from the first portion, of the upper surface of the conductor layer through an upper contact hole selectively formed in the insulating layer.

6 Claims, 13 Drawing Sheets

F I G. 27
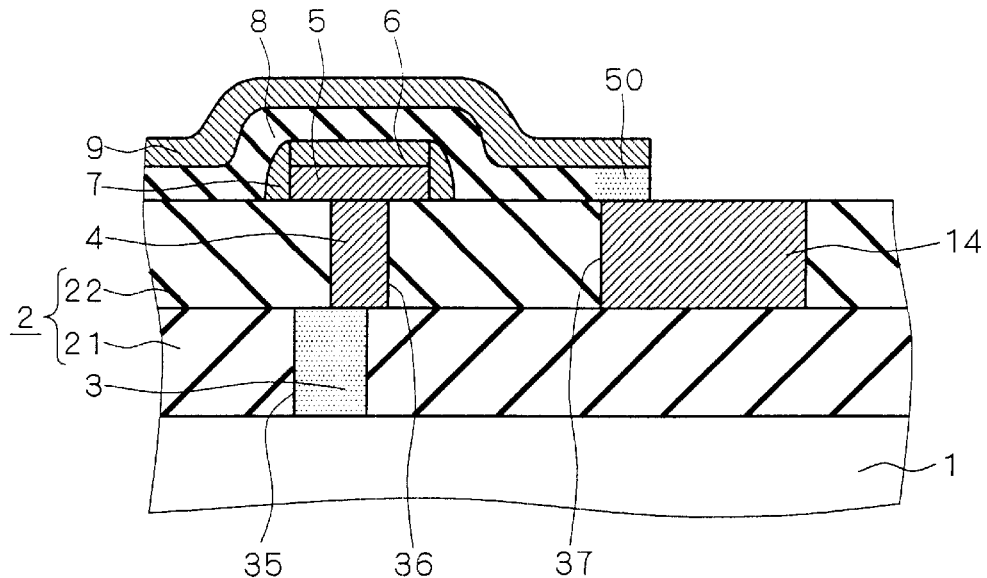

SEMICONDUCTOR DEVICE WITH CAPACITOR USING HIGH DIELECTRIC CONSTANT FILM OR FERROELECTRIC FILM

BACKGROUND OF THE INVENTION

1. Field of the Invention

The present invention relates to a semiconductor device suitable for a DRAM (dynamic random access memory) having a capacitor (capacitive element): employing a high dielectric film or an SRAM (static random access memory) having a capacitor employing a ferroelectric film and a method of manufacturing the same.

2. Description of the Background Art

First, a term employed in this specification is described. Throughout the specification, the term "noble metal" stands for a metal belonging to a group consisting of gold, silver and the platinum metals (Ru, Rh, Pd, Os, Ir and Pt).

A DRAM is generally known as a semiconductor memory device capable of inputting/outputting stored information at random. In general, such a DRAM has a memory cell array serving as a storage area storing numerous information and a peripheral circuit necessary for inputting/outputting the information from/to an external device. A group of memory cells is arranged on the memory cell array, occupying a large area in a semiconductor chip, in the form of a matrix.

A known memory cell for storing unitary memory information has a single MOS (metal oxide semiconductor) transistor and a single capacitor connected thereto. Such a memory cell is referred to as a one-transistor one-capacitor memory cell. This type of memory cell having a simple structure can readily improve the degree of integration of the memory cell array, and is hence widely employed in a DRAM having a large capacity.

Memory cells of the DRAM are classified into some types depending on capacitor structures. A known capacitor is referred to as a stacked capacitor. A principal part of the stacked capacitor is extended onto a gate electrode or a field oxide film, thereby ensuring a large facing area between electrodes.

Due to the aforementioned characteristic, the stacked capacitor can ensure a high capacitance also when elements are refined following integration of the semiconductor memory device. Therefore, the stacked capacitor is increasingly employed following integration of the semiconductor memory device.

However, the stacked capacitor must be more highly formed over a semiconductor substrate in response to refinement of the elements. Following the recent progress of refinement of the elements, it is now becoming difficult to ensure the capacitance required to the capacitor by this method. This also applies to a trench capacitor or a cylindrical capacitor, which is another representative three-dimensional capacitor structure.

Therefore, an attempt of employing a dielectric film consisting of a high dielectric constant material such as BST (barium strontium titanate) as a capacitor dielectric film is made in order to increase the capacitance of the capacitor. FIG. 28 is a sectional view partially showing a memory cell of a DRAM 150 employing a high dielectric constant material such as BST as a capacitor dielectric film. This semiconductor device 150 comprises a semiconductor substrate 1, a lower insulating layer 2, a conductor plug 3, a barrier metal layer 5, a lower electrode film 6, side walls 7, a dielectric film 8, an upper electrode film 9, an upper insulating layer 11, a barrier metal layer 60 and a wire 20. Platinum is employed as the material for the lower electrode film 6 and the upper electrode film 9, and titanium nitride is employed as the material for the barrier metal layers 5 and 60. The dielectric film 8 is formed as a BST dielectric film, and the wire 20 is an aluminum wire. The lower insulating layer 2 and the upper insulating layer 11 are formed as interlayer isolation films.

The semiconductor device 150 is characteristically different from any preceding DRAM in that not polycrystalline silicon but a noble metal such as platinum is employed as the material for a capacitor electrode film of a memory cell. In the DRAM preceding the semiconductor device 150, a silicon oxide film obtained by thermally oxidizing silicon or a silicon nitride film formed by CVD (chemical vapor deposition) is employed as the capacitor dielectric film. Both of silicon oxide and silicon nitride are compounds of silicon, and hence the capacitor dielectric film can be readily formed on a lower electrode film prepared from polycrystalline silicon.

When a dielectric film consisting of a high dielectric constant material such as BST (barium strontium titanate) is formed on a polycrystalline silicon film, however, the electrochemically base polycrystalline silicon film is so readily oxidized that a silicon oxide film is formed on the interface between the dielectric film of BST and the lower electrode film of polycrystalline silicon. This silicon oxide film remarkably reduces electrostatic capacitance of the capacitor due to its low dielectric constant.

In order to prevent this, a noble metal such as electrochemically noble platinum having high oxidation resistance is employed for the upper electrode film 6 and the lower electrode film 9 in the semiconductor device 150. Further, the conductive barrier metal layers (anti-diffusion films) 5 and 60 are interposed on the interfaces between the upper and lower electrode films 6 and 9 and the conductive materials mainly composed of silicon and aluminum, which are electrically connected with the electrode films 6 and 9, for preventing mutual diffusion between silicon and platinum and between aluminum and platinum.

In a process of manufacturing the semiconductor device 150, the upper insulating layer 11 covering the upper electrode film 9 consisting of a noble metal such as platinum must be etched for forming a contact hole 61 and electrically connecting the upper electrode film 9 and the wire 20 with each other through this contact hole 61. In this etching step, however, it is disadvantageously difficult to precisely control etching conditions so that the etching is stopped when the upper surface of the thinly formed upper electrode film 9 is exposed not to cause over-etching. Further, a re-deposition film 12 consisting of a component of a resist film and platinum is disadvantageously formed around the bottom portion of the contact hole 61. The re-deposition film 12 consisting of the component of the resist film and platinum, which is chemically stable and adheres to a portion of the inner wall surface of the contact hole 61 around the bottom portion, is hard to remove. The re-deposition film 12 increases contact resistance.

In order to solve the aforementioned problems, it is possible to assume a capacitor structure obtained by forming an etching stopper layer (not shown) on the upper surface of the upper electrode film 9. When the etching stopper layer is thickly set to a necessary degree in this structure, however, the effective capacitor height is increased. Consequently, an absolute step is disadvantageously increased between a memory cell array having the capacitor and a peripheral circuit having no capacitor. When the material for the upper electrode film 9 is patterned for forming the upper electrode film 9, further, a composite film of a three-layer structure including the etching stopper layer and the dielectric film 8 must be etched. Consequently, the upper electrode film 9 cannot be readily finely worked.

SUMMARY OF THE INVENTION

Thus, an object of the present invention is to provide a semiconductor device capable of preventing over-etching in formation of a contact hole and preventing formation of a re-deposition film without providing an etching stopper layer and a method of manufacturing the same.

A semiconductor device according to a first aspect of the present invention comprises a semiconductor substrate having a main surface, an insulating layer formed on the main surface of the semiconductor substrate, a lower electrode film embedded in the insulating layer, a dielectric film embedded in the insulating layer and covering the lower electrode film, an upper electrode film embedded in the insulating layer and opposed to the lower electrode film through the dielectric film, a conductor plug electrically connecting the lower electrode film and the semiconductor substrate with each other through a lower contact hole selectively formed in the insulating layer, a conductor layer embedded in the insulating layer and electrically connected to the upper electrode film on a first portion defining a part of its upper surface and a wire arranged on the insulating layer and connected to a second portion defining another part, different from the first portion, of the upper surface of the conductor layer through an upper contact hole selectively formed in the insulating layer.

In the semiconductor device according to the first aspect, electrical connection between the upper electrode film and the wire is implemented by electrically connecting the upper electrode film to the first portion of the upper surface of the conductor layer and connecting the wire to the second portion through the upper contact hole.

Dissimilarly to the prior art forming the upper contact hole on the upper electrode film, therefore, allowance for over-etching is improved in formation of the upper contact hole. In other words, manufacturing errors in the semiconductor device can readily be suppressed.

According to a second aspect of the present invention, the conductor plug includes another conductor layer, and the another conductor layer and the conductor layer are identical in height to each other with reference to the main surface of the semiconductor substrate, identical in thickness to each other, and made of the same material.

In the semiconductor device according to the second aspect, the conductor plug includes another conductor layer, which can serve as a barrier layer preventing mutual diffusion between elements forming the lower electrode film and the semiconductor substrate. Further, the conductor layer and the other conductor layer, which are the same in height with each other with reference to the main surface of the semiconductor substrate, identical in thickness to each other and made of the same material, can be simultaneously formed through a single manufacturing step.

According to a third aspect of the present invention, the lower electrode film and the conductor layer are identical in height to each other with reference to the main surface of the semiconductor substrate, identical in thickness to each other, and made of the same material.

In the semiconductor device according to the third aspect, the lower electrode film and the conductor layer, which are the same in height with each other with reference to the main surface of the semiconductor substrate, identical in thickness to each other and made of the same material, can be simultaneously formed through a single manufacturing step.

According to a fourth aspect of the present invention, the semiconductor device further comprises a conductive side wall formed on a side wall surface of the upper electrode film and the dielectric film, and the side wall is connected to the first portion of the conductor layer.

In the semiconductor device according to the fourth aspect, the side wall electrically connects the upper electrode film and the conductor layer with each other, whereby neither mask pattern nor a transfer step therefor is required for electrically connecting the upper electrode film and the conductor layer with each other. In other words, the upper electrode film and the conductor layer can be electrically connected with each other through a simple step.

According to a fifth aspect of the present invention, the dielectric film covers the first potion of the conductor layer and is chemically converted to a conductor in a portion covering the first portion, and the first portion of the conductor layer is electrically connected to the upper electrode film through the portion of the dielectric film converted to a conductor.

In the semiconductor device according to the fifth aspect, the upper electrode film and the conductor layer are electrically connected with each other through the portion of the dielectric film converted to a conductor, whereby neither a mask pattern nor a transfer step therefor is required for electrically connecting the upper electrode film and the conductor layer with each other. In other words, the upper electrode film and the conductor layer can be electrically connected with each other through a simple step.

According to a sixth aspect of the present invention, material of the lower electrode film and the upper electrode film includes a noble metal.

In the semiconductor device according to the sixth aspect, the material for the electrode films includes a noble metal, whereby a high dielectric film can suitably be used for the dielectric film. The upper electrode film is electrically connected to the wire through the conductor layer, whereby no adhesion film results from the noble metal with no etching stopper but connection resistance can be suppressed.

The present invention is also directed to a method of manufacturing a semiconductor device. A method of manufacturing a semiconductor device according to a seventh aspect of the present invention comprises steps of (a) preparing a semiconductor substrate having a main surface, (b) forming, on the semiconductor substrate, a lower insulating layer selectively formed with a lower contact hole passing through upper and lower surfaces thereof and an opening defined at least in the upper surface so that a conductor plug is embedded in the lower contact hole and a conductor layer is embedded in the opening, (c) forming a first conductor material film on the lower insulating layer, (d) patterning the first conductor material film thereby forming a lower electrode film to be electrically connected to the conductor plug, (e) forming a dielectric film covering the lower electrode film and an upper electrode film covering the dielectric film while electrically connecting the upper electrode film to a first portion defining a part of an upper surface of the conductor layer, (f) forming an upper insulating layer covering the upper electrode film, the conductor layer and the lower insulating layer, (g) selectively forming an upper contact hole passing through upper and lower surfaces in the upper insulating layer by etching to open in a second portion, different from the first portion, of the upper surface of the conductor layer, and (h) forming a wire embedded in the upper contact hole and arranged on the upper insulating layer.

In the manufacturing method according to the seventh aspect, electrical connection between the upper electrode film and the wire is implemented by electrically connecting the upper electrode film to the first portion of the upper surface of the conductor layer and connecting the wire to the second portion through the upper contact hole. Dissimilarly to the prior art forming the upper contact hole on the upper electrode film, therefore, allowance for over-etching is improved in formation of the upper contact hole. In other words, manufacturing errors in the semiconductor device can readily be suppressed.

A method of manufacturing a semiconductor device according to an eighth aspect of the present invention comprises steps of (a) preparing a semiconductor substrate having a main surface, (b) forming, on the semiconductor substrate, a lower insulating layer selectively formed with a lower contact hole passing through upper and lower surfaces thereof so that a conductor plug is embedded in the lower contact hole, (c) forming a first conductor material film on the conductor plug and on the lower insulating layer, (d) patterning the first conductor material film thereby forming a lower electrode film electrically connected to the conductor plug while simultaneously forming a conductor layer separated from the lower electrode film on the lower insulating layer, (e) forming a dielectric film covering the lower electrode film and an upper electrode film covering the dielectric film while electrically connecting the upper electrode film to a first portion defining a part of an upper surface of the conductor layer, (f) forming an upper insulating layer covering the upper electrode film, the conductor layer and the lower insulating layer, (g) selectively forming an upper contact hole passing through upper and lower surfaces in the upper insulating layer to open in a second portion, different from the first portion, of the upper surface of the conductor layer, and (h) forming a wire embedded in the upper contact hole and arranged on the upper insulating layer.

In the manufacturing method according to the eighth aspect, electrical connection between the upper electrode film and the wire is implemented by electrically connecting the upper electrode film to the first portion of the upper surface of the conductor layer and connecting the wire to the second portion through the upper contact hole. Dissimilarly to the prior art forming the upper contact hole on the upper electrode film, therefore, allowance for over-etching is improved in formation of the upper contact hole. In other words, manufacturing errors in the semiconductor device can readily be suppressed. Further, the lower electrode film and the conductor layer are simultaneously formed through a single manufacturing step, whereby the manufacturing. steps are simplified.

According to a ninth aspect of the present invention, the step (b) comprises steps of (b-1) forming an insulator material layer serving as the material for the lower insulating layer on the semiconductor substrate, (b-2) etching the insulator material layer thereby selectively forming the lower contact hole and the opening to pass through upper and lower surfaces together, (b-3) forming a first conductor material layer to fill up the lower contact hole and the opening, (b-4) etching the first conductor material layer thereby retracting its upper surface into the inner parts of the contact hole and the opening, (b-5) forming a second conductor material layer to fill up the lower contact hole and the opening and cover the insulator material layer after the step (b-4), and (b-6) retracting an upper surface of the second conductor material layer to be flush with the upper surface of the insulator material layer.

In the manufacturing method according to the ninth aspect, the conductor plug is formed by the first and second conductor material layers, whereby the second conductor material layer can serve as a barrier layer preventing mutual diffusion between elements forming the lower electrode film and the semiconductor substrate. Further, the lower contact hole and the opening are simultaneously formed through a single manufacturing step while the conductor layer and the second conductor material layer are also simultaneously formed through a single manufacturing step, whereby the manufacturing steps are simplified.

According to a tenth aspect of the present invention, the step (b) comprises steps of (b-1) forming a first insulator material layer on the semiconductor substrate, (b-2) etching the first insulator material layer thereby selectively forming a first lower contact hole defining a part of the lower contact hole to pass through upper and lower surfaces of the first insulator material layer, (b-3) forming a first conductor material layer to fill up the first lower contact hole and cover the first insulator material layer, (b-4) retracting an upper surface of the first conductor material layer to be flush with the upper surface of the first insulator material layer, (b-5) forming a second insulator material layer to cover the upper surfaces of the first conductor material layer and the first insulator material layer after the step (b-4), (b-6) etching the second insulator material layer thereby selectively forming a second lower contact hole communicating with the first lower contact hole and defining another part of the lower contact hole and the opening to pass through upper and lower surfaces of the second insulator material layer together, (b-7) forming a second conductor material layer to fill up the second lower contact hole and the opening and cover the second insulator material layer, and (b-8) retracting an upper surface of the second conductor material layer to be flush with the upper surface of the second insulator material layer.

In the manufacturing method according to the tenth aspect, the conductor plug is formed by the first and second conductor material layers, whereby the second conductor material layer can serve as a barrier layer preventing mutual diffusion between elements forming the lower electrode film and the semiconductor substrate. Further, the conductor layer and the second conductor material layer are simultaneously formed through a single manufacturing step, whereby the manufacturing steps are simplified.

According to an eleventh aspect of the present invention, the step (e) comprises steps of (e-1) forming a dielectric material film to cover the upper surface of the lower insulating layer, the lower electrode film and the conductor layer, (e-2) forming a second conductor material film on the dielectric material film, (e-3) patterning the dielectric material film and the second conductor material film thereby forming the dielectric film covering the lower electrode film and the upper electrode film covering the dielectric film so that side wall surface thereof is adjacent to the first portion of the conductor layer, (e-4) forming a third conductor material film covering the upper electrode film, the conductor layer and the lower insulating layer, and (e-5) etching the third conductor material film thereby removing the third conductor material film while leaving a side wall covering the first portion of the conductor layer as well as the side wall surfaces of the upper electrode film and the dielectric film adjacent to the first portion.

In the manufacturing method according to the eleventh aspect, the upper electrode film and the conductor layer are electrically connected with each other by forming the side wall with no requirement for a mask pattern and a transfer step therefor.

In other words, the upper electrode film and the conductor layer can be electrically connected with each other through a simple step.

According to a twelfth aspect of the present invention, the step (e) comprises steps of (e-1) forming a dielectric material film to cover the upper surface of the lower insulating layer, the lower electrode film and the conductor layer, (e-2) forming a second conductor material film on the dielectric material film, (e-3) patterning the dielectric material film and the second conductor material film thereby forming the dielectric film covering the lower electrode film and the upper electrode film covering the dielectric film to also cover the first portion of the conductor layer, and (e-4) performing heating in any of the steps (e-1) to (e-3) or after the step (e-3), while the material for the conductor layer and the material for the dielectric material film are so selected that a portion of the dielectric material film covering the conductor layer is converted to a conductor due to reductive action of the conductor layer, and a portion of the dielectric material film or the dielectric film covering the conductor layer is converted to a conductor through the step (e-4).

In the manufacturing method according to the twelfth aspect, the upper electrode film and the conductor layer are electrically connected with each other by partially converting the dielectric film to a conductor with no requirement for a mask pattern and a transfer step therefor. In other words, the upper electrode film and the conductor layer can be electrically connected with each other through a simple step.

According to a thirteenth aspect of the present invention, a material including a noble metal is employed for the lower electrode film and the upper electrode film.

In the manufacturing method according to the thirteenth aspect, the material including a noble metal is employed for the electrode films, whereby a high dielectric film can suitably be used for the dielectric film. The upper electrode film is electrically connected to the wire through the conductor layer, whereby no adhesion film results from the noble metal with no etching stopper but connection resistance can be suppressed.

Thus, an object of the present invention is to provide a semiconductor device capable of preventing over-etching in formation of a contact hole and preventing formation of a re-deposition film without providing an etching stopper layer and a method of manufacturing the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 26 and 27 illustrate steps of manufacturing the semiconductor device shown in FIG. 25.

DESCRIPTION OF THE PREFERRED EMBODIMENTS

Embodiment 1

(Structure of Device)

Figure 1:
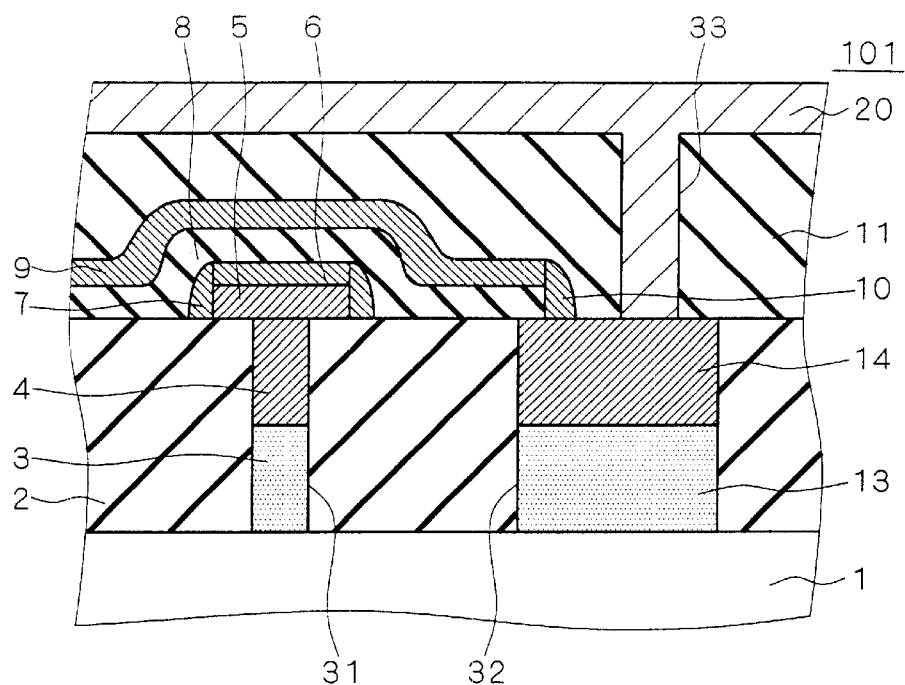
FIG. 1 is a longitudinal sectional view of a semiconductor device according to an embodiment 1 of the present invention.
Figure 28:
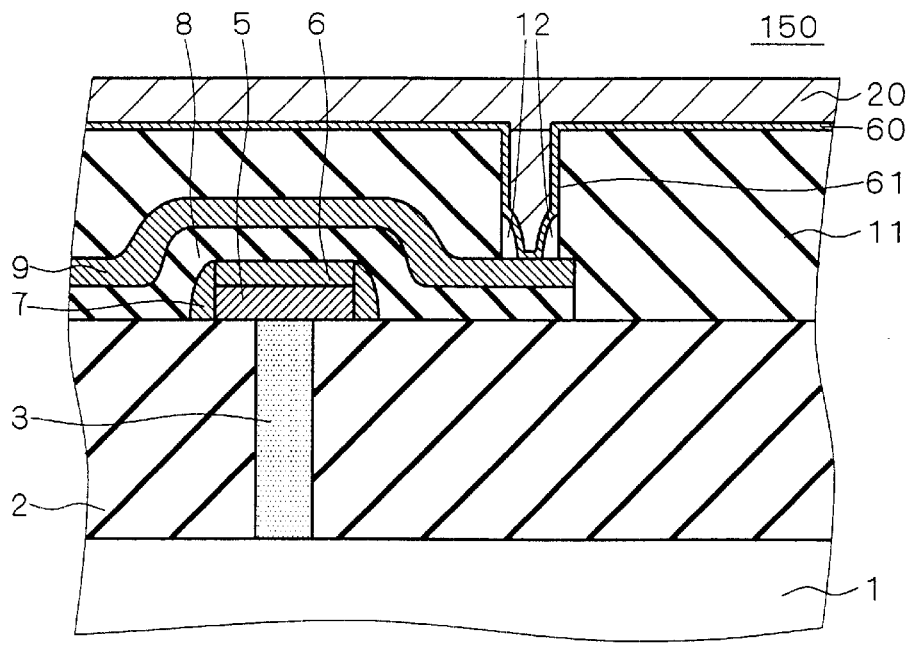
FIG. 28 is a longitudinal sectional view of a conventional semiconductor device.

FIG. 1 is a vertical sectional view partially showing a semiconductor device 101 according to an embodiment 1 of the present invention. This semiconductor device 101 is formed as a DRAM, and FIG. 1 illustrates a capacitor provided in its memory cell and a peripheral part thereof. In the following figures, parts identical or corresponding to (having the same functions as) those of the conventional device shown in FIG. 28 are denoted by the same reference numerals, to clarify the correspondence.

The semiconductor device 101 comprises a semiconductor substrate 1 having a main surface, a lower insulating layer 2 serving as an interlayer isolation film formed on the main surface of the semiconductor substrate I and an upper insulating layer 11 serving as an interlayer isolation film formed thereon. A MOS transistor (not shown) and an element isolation region (not shown) prepared from a silicon oxide film or the like are formed in the semiconductor substrate 1, similarly to the conventional semiconductor device 150. A lower contact hole 31 and an opening 32 are selectively formed in the lower insulating layer 2. Both of the lower contact hole 31 and the opening 32 pass through upper and lower surfaces of the lower insulating layer 2. For example, a silicon substrate is employed for the semiconductor substrate 1, and the lower and upper insulating layers 2 and 11 are formed as silicon oxide layers.

A polysilicon plug 3 and a conductor layer 4 which is a titanium nitride plug are embedded in the lower contact hole 31, while a polysilicon layer 13 and a conductor layer 14 are embedded in the opening 32. The polysilicon plug 3 and the polysilicon layer 13 are doped with impurities, to serve as conductors. The conductor layer 14 is made of the same material as the conductor layer 4, i.e., titanium nitride (TiN).

The polysilicon plug 3 and the polysilicon layer 13 are connected to the main surface of the semiconductor substrate 1, and identical in thickness to each: other. The conductor layers 4 and 14 are formed on the polysilicon plug 3 and the polysilicon layer 13 respectively, and identical in thickness to each other. Therefore, the polysilicon plug 3 and the polysilicon layer 13 can be simultaneously formed through the same step, and the conductor layers 4 and 14 can also be simultaneously formed through the same step.

A capacitor having a lower electrode film 6, side walls 7, a dielectric film 8, an upper electrode film 9 and a side wall 10 is embedded in the upper insulating layer 11. The lower electrode film 6 is formed over the lower contact hole 31, and connected to the conductor layer 4 through a barrier metal layer 5 made of titanium nitride. The side walls 7 are conductors formed on side wall surfaces of the barrier metal layer 5 and the lower electrode film 6. The material for the lower electrode film 6 and the side walls 7 is platinum. The conductor layer 4 made of titanium nitride serves as a barrier metal layer for the lower electrode film 6, and the barrier metal layer 5 identically made of titanium nitride serves also as a close contact layer for the lower electrode film 6.

The dielectric film 8, made of BST which is a high dielectric substance, covers the lower electrode film 6 and the side walls 7. The upper electrode film 9 is opposed to the lower electrode film 6 through the dielectric film 8. The side walls 10 made of conductors are formed on the side wall surfaces of the upper electrode film 9 and the dielectric film 8. The material for the upper electrode film 9 and the side wall 10 is platinum. The dielectric film 8 and the upper electrode film 9 extend to reach the upper surface of the conductor layer 14. Thus, the side wall 10 is connected to a part (referred to as a first portion) of the upper surface of the conductor layer 14. In other words, the upper electrode film 9 is connected to the upper surface of the conductor layer 14 through the side walls 10. The conductor layer 14 serves also as a barrier metal layer for the side wall 10.

A wire 20 is arranged on the upper insulating layer 11. The wire 20 is mainly composed of aluminum, i.e., it is an aluminum wire. The upper insulating layer 11 is selectively formed with an upper contact hole 33 opening on another part (referred to as a second portion), different from the aforementioned first potion, of the upper surface of the conductor layer 14. The upper contact hole 33 passes through the upper and lower surfaces of the upper insulating layer 11. A part of the 20 is embedded in the upper contact hole 33, to be connected to the second portion of the conductor layer 14.

(Method of Manufacturing the Device)

Figure 2:
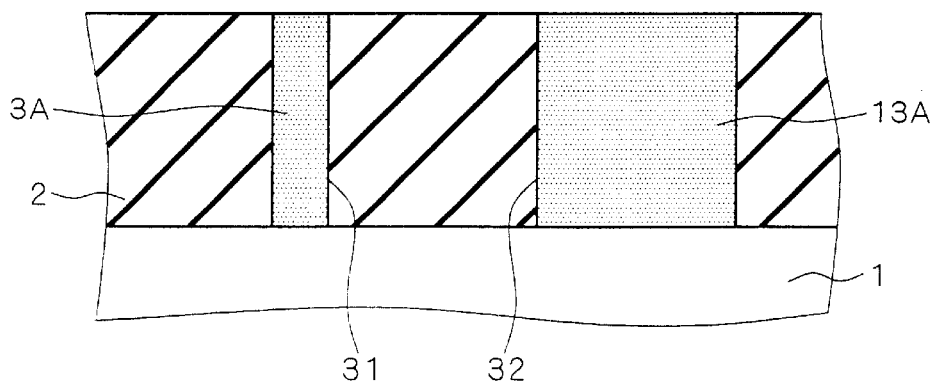
FIGS. 2 to 14 illustrate steps of manufacturing the semiconductor device shown in FIG. 1.

FIGS. 2 to 14 illustrate steps of a method of manufacturing the semiconductor device 101. In order to manufacture the semiconductor device 101, the step shown in FIG. 2 is first carried out. In the step shown in FIG. 2, the semiconductor substrate 1 is first prepared. The semiconductor substrate 1 is formed with a capacitor lower structure of an element isolation oxide film (not shown), an active region (not shown), a transistor (not shown) and the like through steps similar to those for the conventional semiconductor device 150.

Thereafter an insulator material layer for defining the lower insulating layer 2 is formed on the main surface of the semiconductor substrate 1. The material for the insulator material layer is a silicon oxide, for example. Then, the insulator material layer is etched thereby selectively forming the lower contact hole 31 and the opening 32 to pass through the upper and lower surfaces together. Thus, the lower insulating layer 2 is formed. Then, polysilicon layers 3A and 13A are formed to fill up the lower contact hole 31 and the opening 32 respectively. The polysilicon layers 3A and 13A are doped with impurities.

Figure 3:
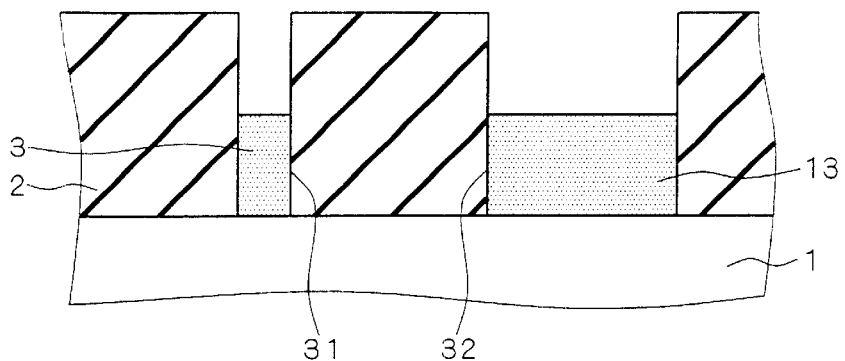

In the next step shown in FIG. 3, the polysilicon layers 3A and 13A are so etched as to retract the upper surfaces thereof into the lower contact hole 31 and the opening 32. Thus, the polysilicon plug 3 and the polysilicon layer 13 are formed. The depth for retracting the polysilicon plug 3 and the polysilicon layer 13 is set to 50 nm to 300 nm, for example, depending on the thickness of the lower insulating layer 2 and the subsequent step of forming the conductor layers 4 and 14.

Figure 4:
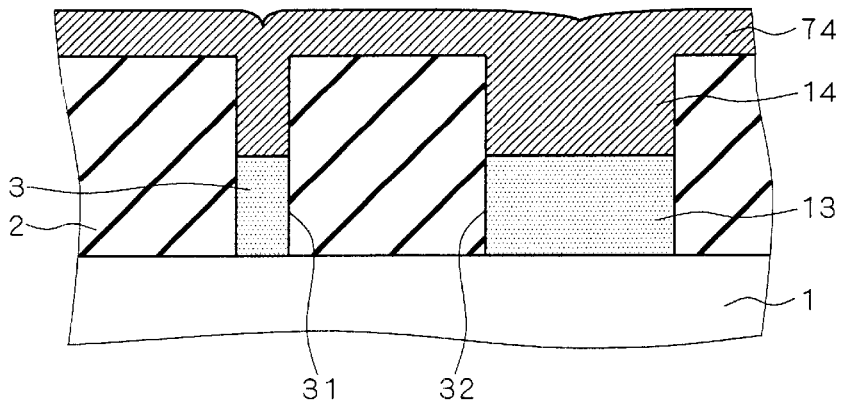
Figure 5:
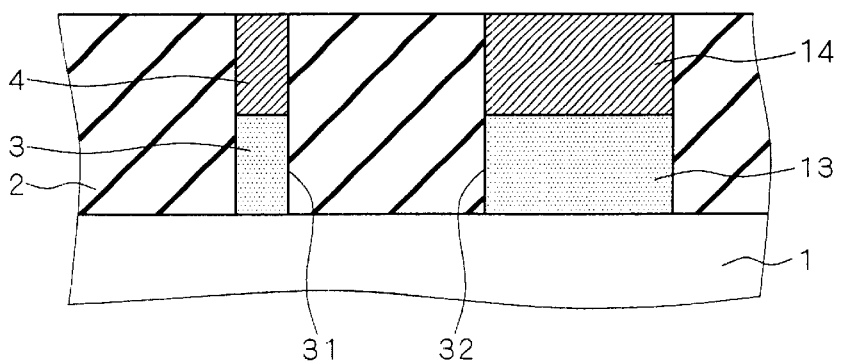

In the next step shown in FIG. 4, a conductor material layer 74 of titanium nitride layer is formed to fill up the lower contact hole 31 and the opening 32 and cover the lower insulating layer 2. This conductor material layer 74 is formed in a thickness of 100 nm by CVD at a film forming temperature of 600° C. with source gas of titanium tetrachloride and ammonia, for example. In the next step shown in FIG. 5, the upper surface of the conductor material layer 74 is retracted to be flush with the upper surface of the lower insulating layer 2. Thus, the conductor layers 4 and 14 are formed. In order to retract the upper surface of the conductor material layer 74, plasma etching may be performed with etching gas mainly composed of chlorine gas, for example. Alternatively, CMP (chemical mechanical polishing) may be employed.

Figure 6:
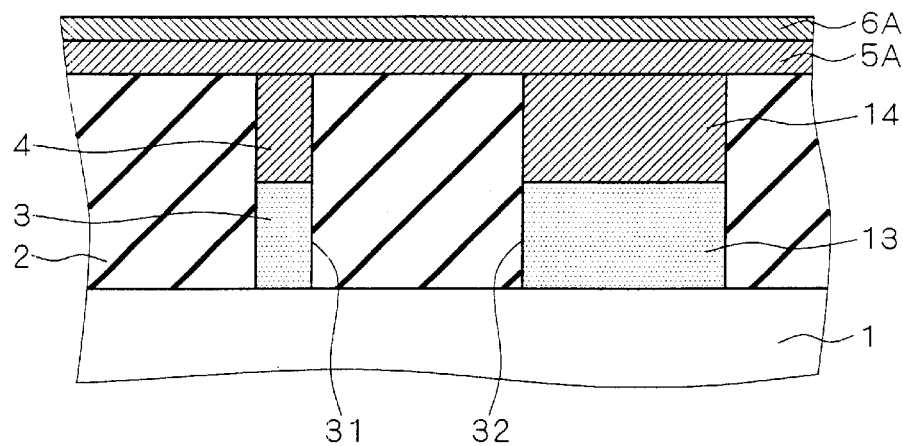

In the next step shown in FIG. 6, a titanium nitride film 5A for defining the barrier metal layer 5 and a platinum film 6A for defining the lower electrode film 6 are formed on the lower insulating layer 2. The titanium nitride film 5A is formed in a thickness of 50 nm at a film forming temperature of 200° by executing reactive sputtering under a mixed gas atmosphere of argon and nitrogen, for example. The platinum film 6A is formed in a thickness of 100 nm at a film forming temperature of 300° C. by executing sputtering under an argon atmosphere, for example.

Figure 7:
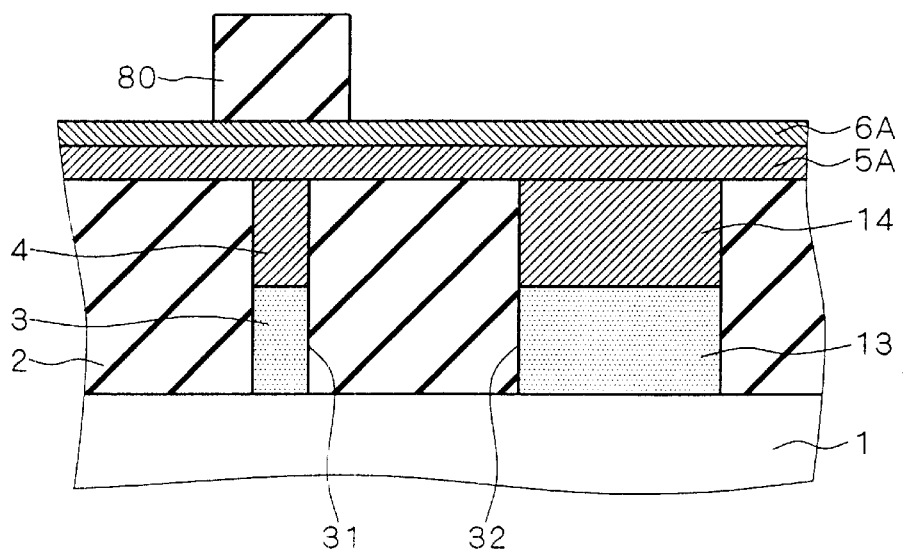
Figure 8:
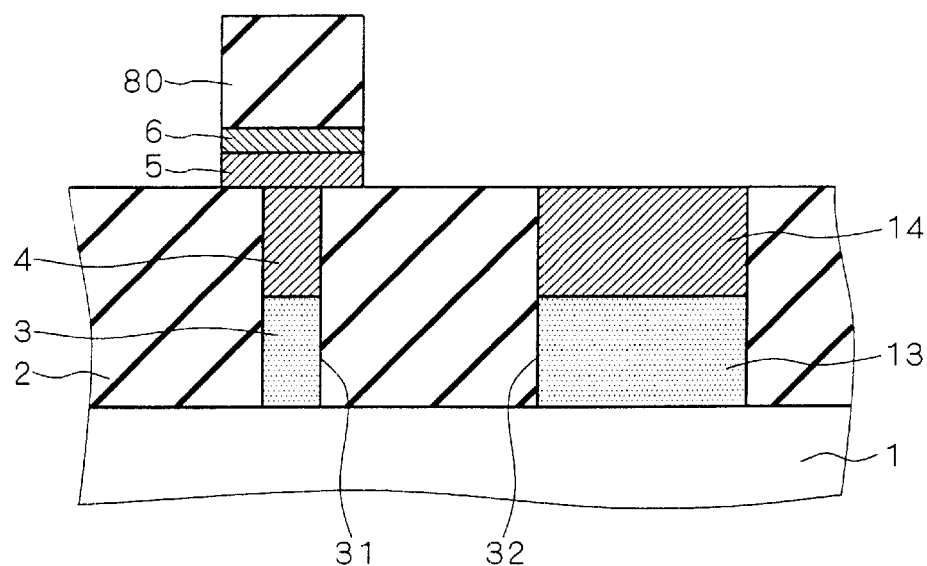
Figure 9:
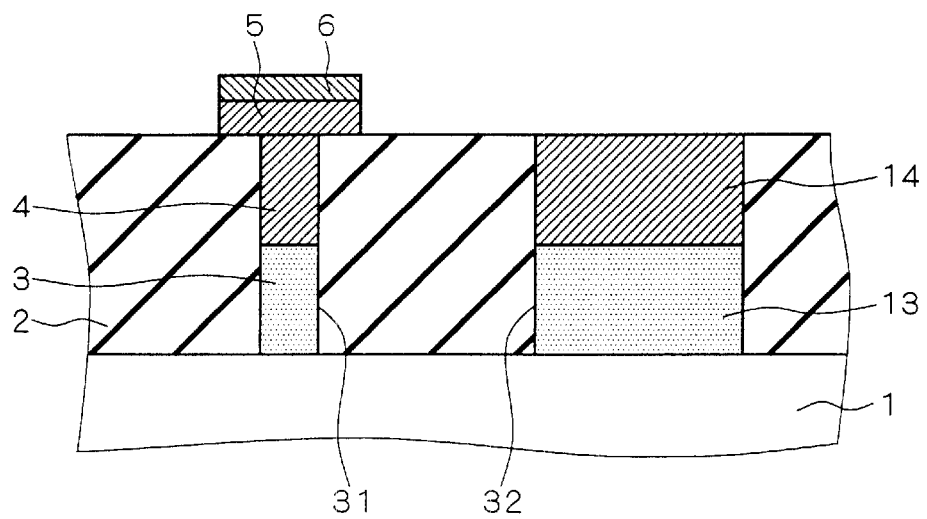

In the next step shown in FIG. 7, a resist pattern 80 is formed on a portion of the upper surface of the platinum film 6A located above the lower contact hole 31. In the next step shown in FIG. 8, the resist pattern 80 is employed as a screen for executing etching, thereby patterning the titanium nitride film 5A and the platinum film 6A. Chlorine/argon plasma, for example, is employed for this etching. As the result of the patterning, the barrier metal layer 5 and the lower electrode film 6 are formed immediately under the resist pattern 80. The barrier metal layer 5 is integrally coupled with upper surface of the conductor layer 4. Thereafter the resist pattern 80 is removed in the step shown in FIG. 9. The resist pattern 80 is removed by ashing with oxygen plasma, for example.

Figure 10:
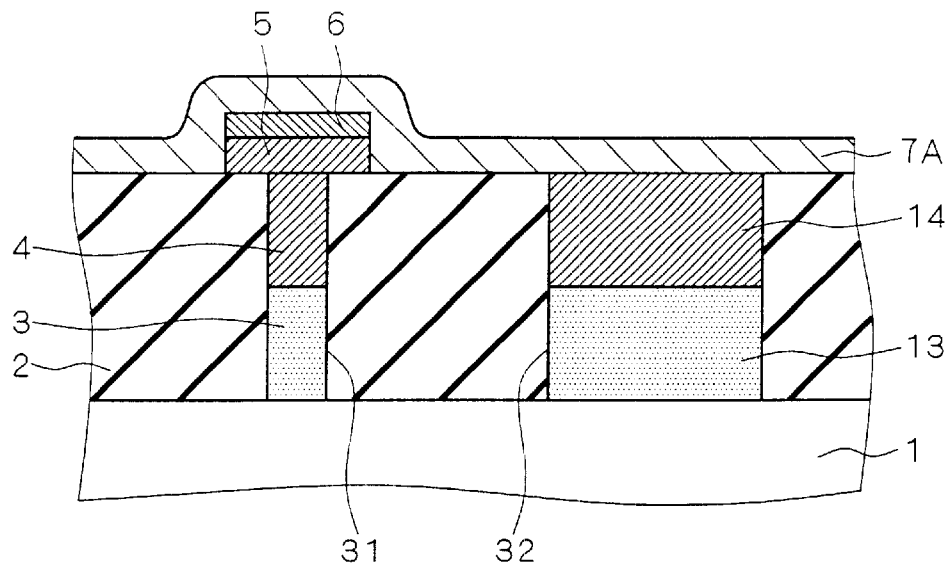

In the next step shown in FIG. 10, a platinum film 7A for defining the side walls 7 is formed to cover the upper surface of the lower insulating layer 2 and the lower electrode film 6. The platinum film 7A is formed by sputtering, for example. The width of the electrode including the upper electrode film 9 and the side walls 7 varies with the thickness of the platinum film 7A. The thickness of the platinum film 7A is set to 30 nm, for example, in a flat portion.

Figure 11:
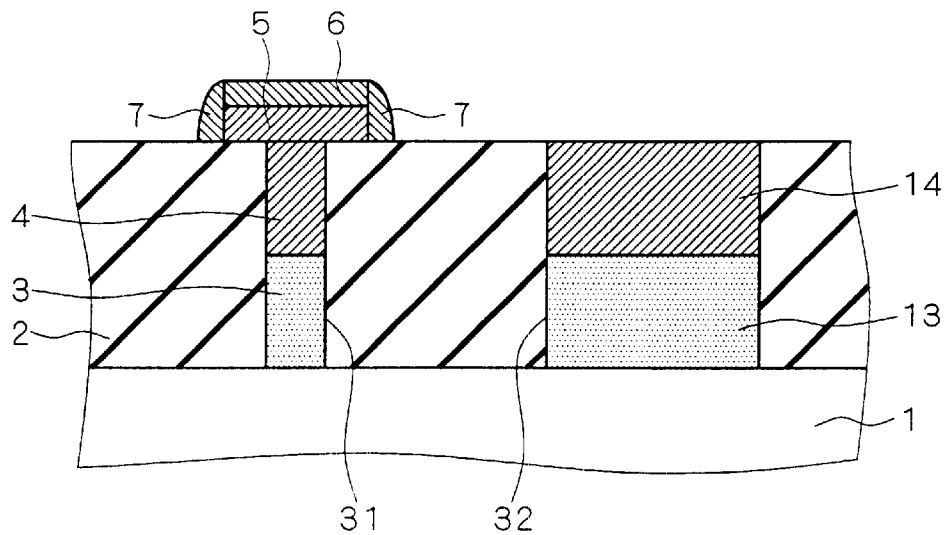

In the next step shown in FIG. 11, the platinum film 7A is etched back thereby forming the side walls 7 on the side wall surfaces of the barrier metal layer 5 and the lower electrode film 6. In the next step shown in FIG. 12, a BST film 8A and a platinum film 9A are formed to cover the upper surface of the lower insulating layer 2, the lower electrode film 6 and the side walls 7. These films 8A and 9A are not restricted in a method of forming the same but can be formed by sputtering, for example. In order to compensate for insufficient coverage on the side surfaces of the lower electrode film 6, the BST film 8A is formed to be 80 nm in thickness, for example, on a flat portion.

Figure 13:
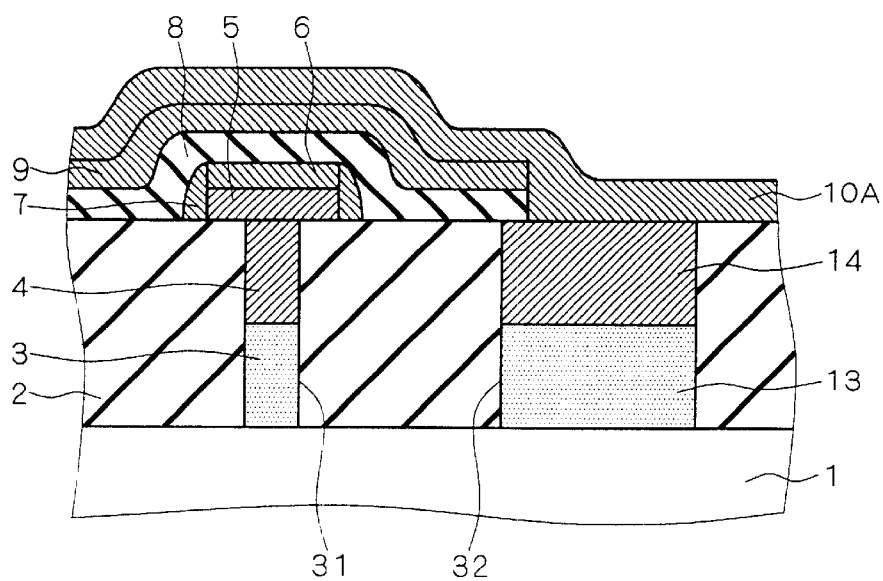

In the next step shown in FIG. 13, the BST film 8A and the platinum film 9A are patterned thereby forming the dielectric film 8 covering the lower electrode film 6 and the side walls 7 and the upper electrode film 9. The patterning is so performed that the side wall surfaces of the dielectric film 8 and the upper electrode film 9 are adjacent to the first portion of the upper surface of the conductor layer 14 formed with the side wall 10 in a later step. The patterning is performed by selective etching, for, example. Thereafter a platinum film 10A is formed to cover the upper insulating film 9, the conductor layer 14 and the lower insulating layer 2.

Figure 14:
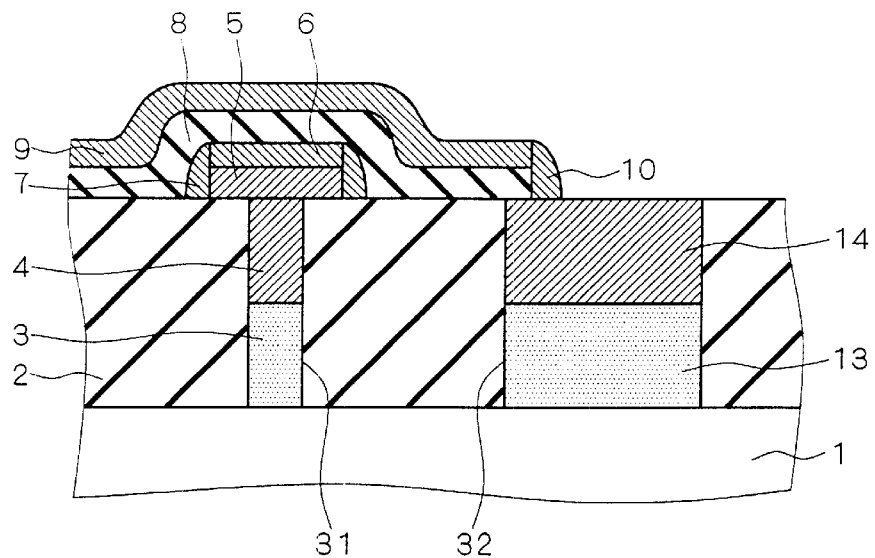

In the next step shown in FIG. 14, the platinum film 10A is etched thereby forming the side wall 10 on the first portion of the conductor layer 14, the side wall of the dielectric film 8 and the side wall of the upper electrode film 9.

Referring again to FIG. 1, an insulating material layer (e.g., a silicon oxide layer) for defining the upper insulating layer 11 is formed to cover the upper electrode film 9, the side wall 10, the conductor layer 14 and the lower insulating layer 2. Thereafter the upper contact hole 33 passing through the upper and lower surfaces is selectively formed in the insulating material layer by etching to open on the second portion, different from the first portion, of the upper surface of the conductor layer 14. Thus, the upper insulating layer 11 is formed. Then, the wire 20 is formed to be embedded in the upper contact hole 33 and to be arranged on the upper insulating layer 11. The semiconductor device 101 is completed through the aforementioned steps.

(Another Exemplary Device)

Figure 15:
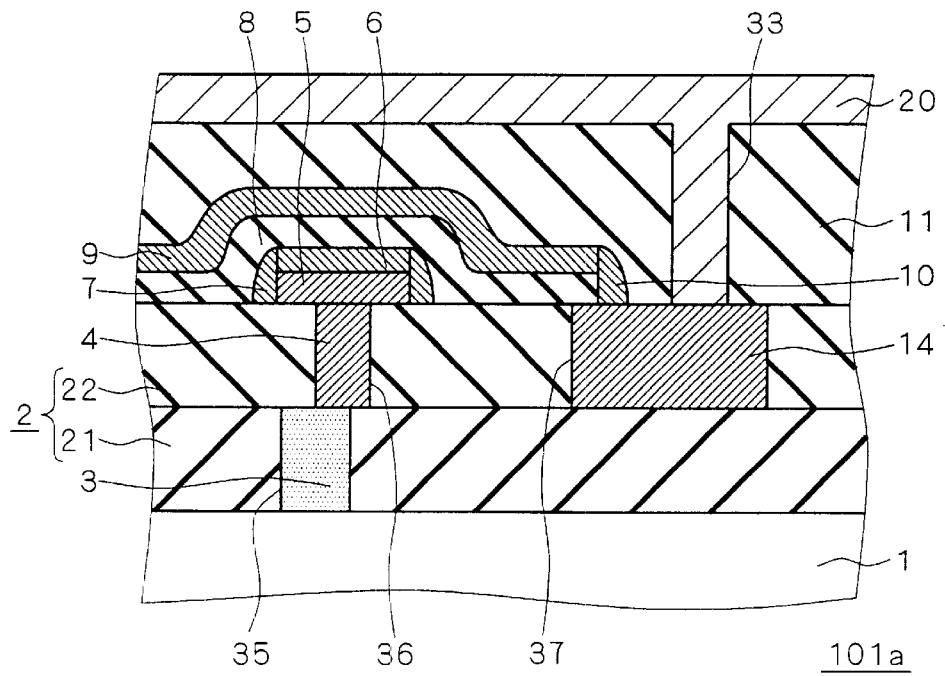
FIG. 15 is a longitudinal sectional view showing another semiconductor device according to the embodiment 1.

In the semiconductor device 101, the conductor layer 14 is connected to the semiconductor substrate 1 through the polysilicon layer 13. Alternatively, a conductor layer 14 may be isolated from a semiconductor substrate 1 by a lower insulating layer 2, as shown in a sectional view of FIG. 15. In a semiconductor device 101a shown in FIG. 15, the lower insulating layer 2 has a two-layer structure including insulating layers 21 and 22. A polysilicon plug 3 is embedded in a lower contact hole 35 passing through the insulating layer 21, and a conductor layer 4 is embedded in a lower contact hole 36 passing through the insulating layer 22. The lower contact holes 35 and 36, which may be displaced from each other within a certain limit, are formed to communicate with each other. The conductor layer 14 is embedded in an opening 37 passing through the insulating layer 22.

Figure 16:
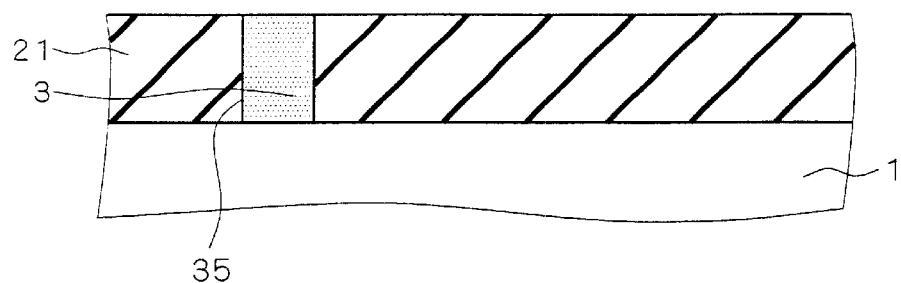
FIGS. 16 to 18 illustrate steps of manufacturing the semiconductor device shown in FIG. 15.
Figure 17:
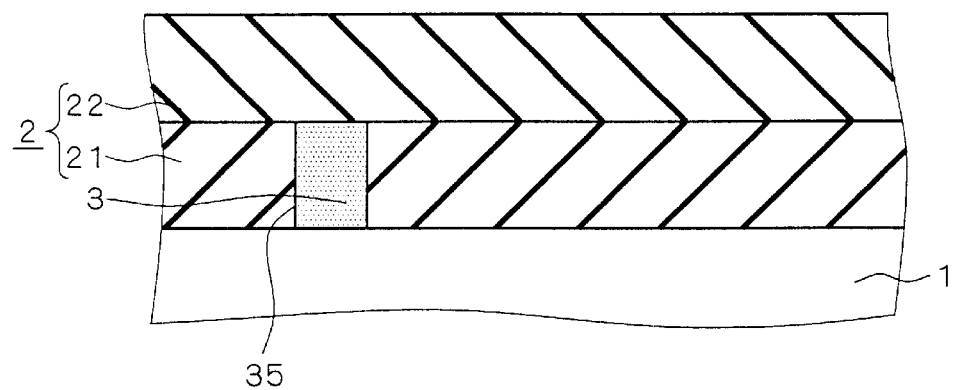
Figure 18:
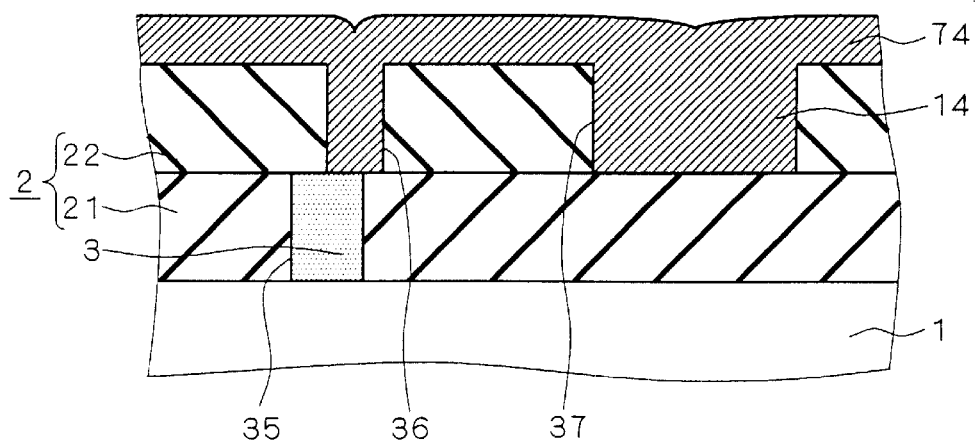

In order to manufacture the semiconductor device 101a, steps shown in FIGS. 16 to 18 are carried out in place of those shown in FIGS. 2 to 4. In the step shown in FIG. 16, a semiconductor substrate 1 is first prepared similarly to the step shown in FIG. 2, and a capacitor lower structure is formed in the semiconductor substrate 1. Thereafter an insulator material layer for defining the insulating layer 21 is formed on the main surface of the semiconductor substrate 1. Then, the insulator material layer is etched thereby selectively forming the lower contact hole 35 to pass through the upper and lower surfaces. Then, a polysilicon layer is formed to fill up the lower contact hole 35 and cover the insulating layer 21. The polysilicon layer is doped with an impurity. Thereafter etching or CMP, for example, is executed for retracting the upper surface of the polysilicon layer to be flush with the upper surface of the insulating layer 21, thereby forming the polysilicon plug 3 embedded in the lower contact hole 35.

In the next step shown in FIG. 17, an insulator material layer for defining the insulating layer 22 is formed to cover the upper surface of the polysilicon plug 3 and the upper surface of the insulating layer 21. In the next step shown in FIG. 18, the insulator material layer is etched thereby selectively forming the lower contact hole 36 communicating with the lower contact hole 35 and the opening 37 to pass through the upper and lower surfaces of the insulator material layer together. Thus, the insulating layer 22 is formed. Then, a conductor material layer 74 is formed to fill up the lower contact hole 36 and the opening 37 and cover the insulating layer 22. Subsequent steps are similar to those shown in FIGS. 5 to 14.

(Advantages of Device)

In each of the semiconductor devices 101 and 101a, as hereinabove described, the upper electrode film 9 is electrically connected to the first portion of the upper surface of the conductor layer 14 and the wire 20 is connected to the second portion through the upper contact hole 33, thereby implementing electrical connection between the upper electrode film 9 and the wire 20. Dissimilarly to the prior art forming the upper contact hole 33 on the upper electrode film 9, therefore, allowance for over-etching is improved in formation of the upper contact hole 33. In other words, manufacturing errors in the device 101 or 101a can readily be lowered.

Figure 19:
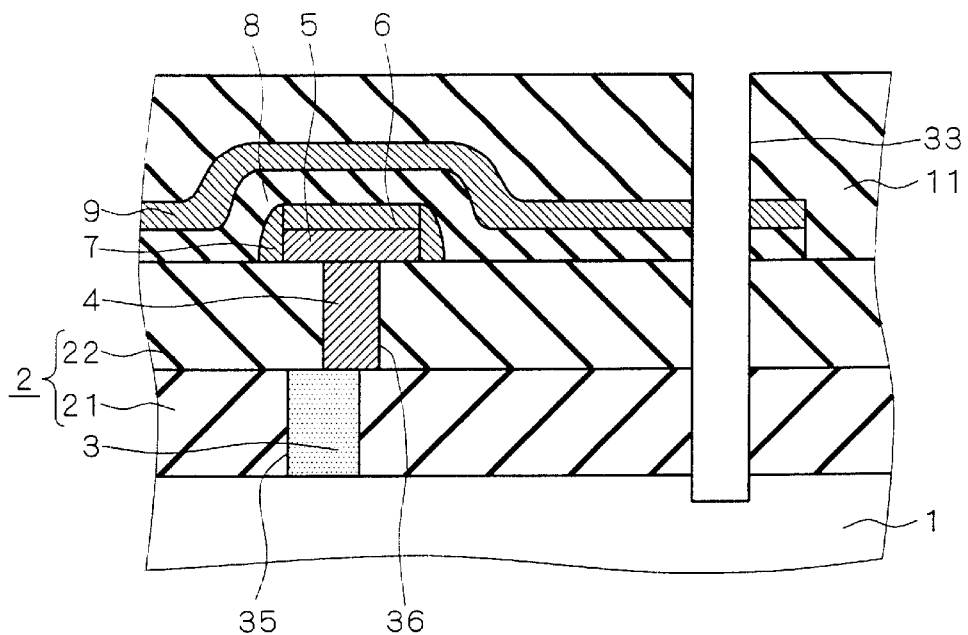
FIG. 19 is a reference diagram compared with the steps of manufacturing the semiconductor device shown in FIG. 15.
Figure 20:
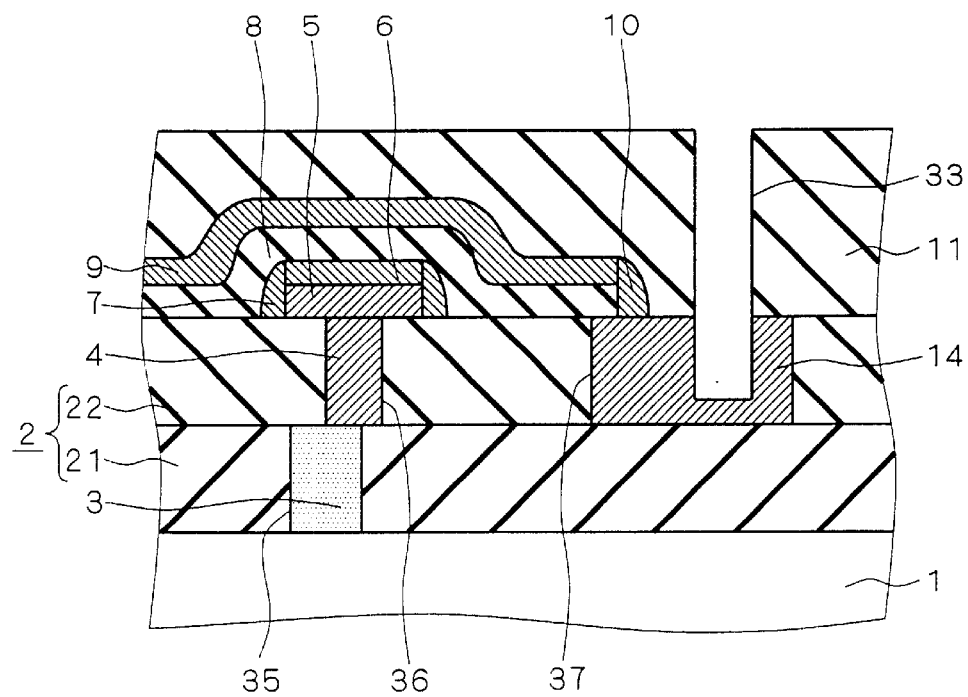
FIG. 20 is an explanatory diagram showing an advantage of the steps of manufacturing the semiconductor device shown in FIG. 15.

FIGS. 19 and 20 show this advantage in detail. FIG. 19 illustrates an etching step for forming the upper contact hole 33 in the conventional semiconductor device 150 having no conductor layer 14. In the semiconductor device 150, the etching may not be stoppable in a stage where the upper surface of the thinly formed upper electrode film 9 is exposed unless etching conditions are controlled in sufficiently high accuracy, to result in over-etching shown in FIG. 19. In the semiconductor device 101 or 101a, on the other hand, the upper contact hole 33 may be formed on the conductor layer 14, and hence over-etching is stopped in the conductor layer 14 as shown in FIG. 20 even if accuracy of etching conditions is low. The conductor layer 14, formed in the lower insulating layer 2 dissimilarly to the upper electrode film 9, can be set to a sufficient thickness without increasing the height of the capacitor. Allowance for etching can be further increased by selecting the materials for the upper insulating layer 11 and the conductor layer 14 so that the conductor layer 14 has a lower etching rate as compared with the upper insulating layer 11 regardless of the thickness of the conductor layer 14.

Further, the side wall 10 electrically connects the upper electrode film 9 and the conductor layer 14 with each other, whereby neither a mask pattern nor a transfer step therefor is required for electrically connecting the upper electrode film 9 and the conductor layer 14. In other words, electrical connection between the upper electrode film 9 and the conductor layer 14 is implemented through a simple step.

In the semiconductor device 101 or 101a, further, a noble metal is employed as the material for the lower electrode film 6 and the upper electrode film 9, whereby a high dielectric film of BST or the like is suitably employed for the dielectric film 8. The upper contact hole 33 does not have to be formed on the upper electrode film 9, whereby no adhesion film 12 (FIG. 28) is formed but contact resistance can be suppressed with no etching stopper on the upper electrode film 9. Further, a fine contact part can be formed with excellent dimensional accuracy without working the noble metal which is hard to work, to obtain a semiconductor device having a capacitor readier to manufacture and improved in manufacturing yield.

In addition, the conductor layer 4 is interposed between the lower electrode film 6 and the polysilicon plug 3, whereby the lower electrode film 6 and the polysilicon plug 3 can be prevented from mutual diffusion. Further, the conductor layers 4 and 14 are simultaneously formed through a single step. Particularly in the semiconductor device 101, the lower contact hole 31 and the opening 32 are simultaneously formed through a single step, whereby the manufacturing steps are further simplified.

Embodiment 2

Figure 21:
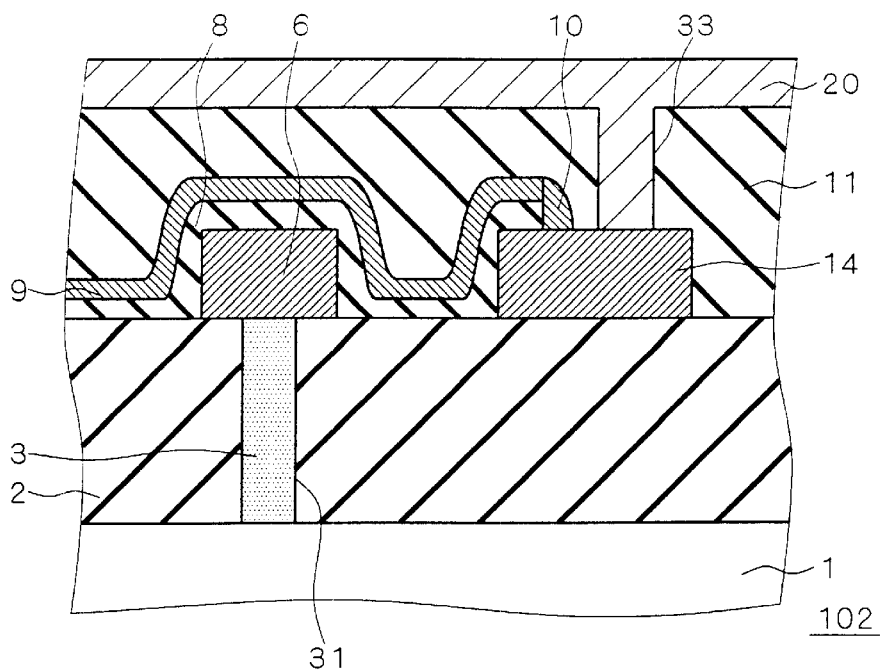
FIG. 21 is a longitudinal sectional view of a semiconductor device according to an embodiment 2 of the present invention.

FIG. 21 is a vertical sectional view partially showing a semiconductor device 102 according to an embodiment 2 of the present invention. This semiconductor device 102 is formed as a DRAM similarly to the semiconductor devices 101 and 101a, and FIG. 21 illustrates a capacitor provided in its memory cell and a peripheral portion thereof.

The semiconductor device 102 is characteristically different from the semiconductor devices 101 and 101a in that a polysilicon plug 3 is embedded in a lower contact hole 31 formed in a lower insulating layer 2 and that a conductor layer 14 and a lower electrode film 6 are formed on the upper surface of the lower insulating layer 2 by the same material in the same thickness. Both of the lower electrode film 6 and the conductor layer 14 are made of titanium nitride and a dielectric film 8 is made of tantalum oxide (TaOx), while an upper electrode film 9 and a side wall 10 are made of ruthenium. The semiconductor device 102 shown in FIG. 21 is provided with no barrier metal layer 5 and side walls 7 (FIG. 1), which can alternatively be provided.

Figure 22:
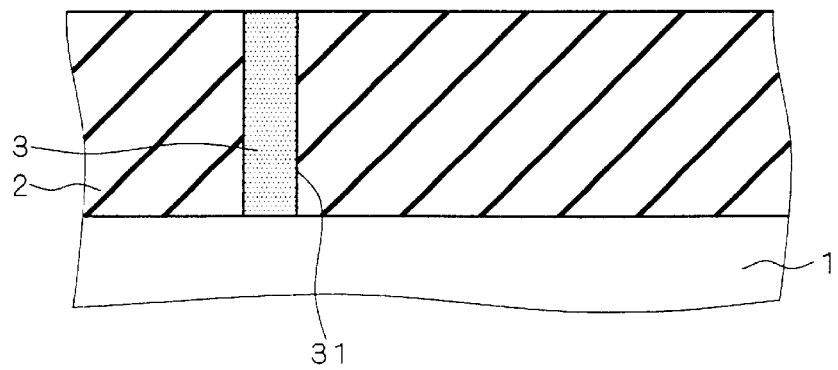
FIGS. 22 to 24 illustrate steps of manufacturing the semiconductor device shown in FIG. 21.
Figure 23:
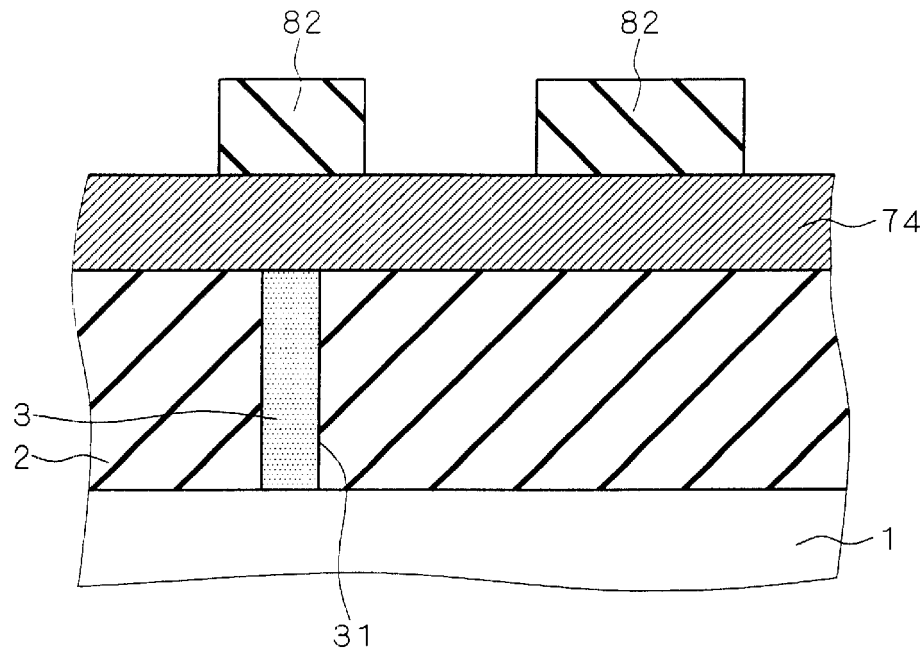
Figure 24:
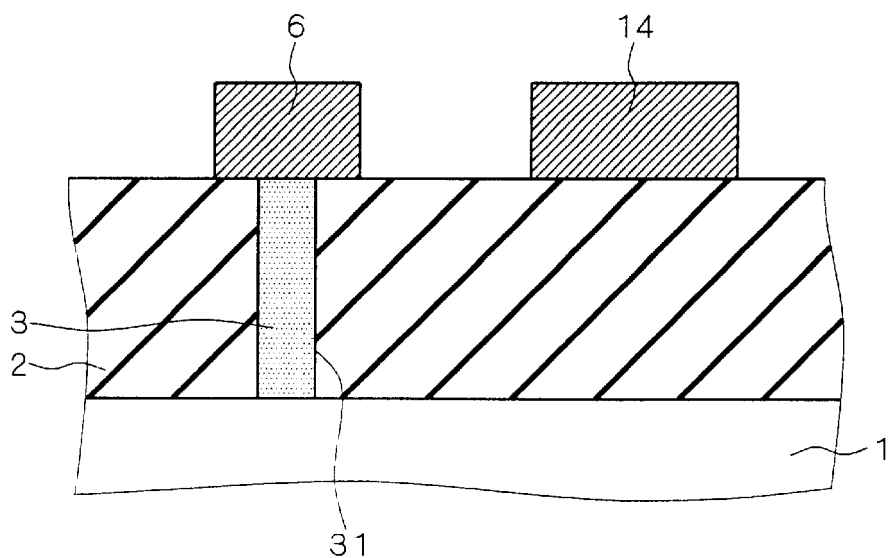

In order to manufacture the semiconductor device 102, steps shown in FIGS. 22 to 24 are carried out in place of those shown in FIGS. 2 to 11. A semiconductor substrate 1 is first prepared similarly to the step shown in FIG. 2, and thereafter a capacitor lower structure is formed in the semiconductor substrate 1. Then, an insulator material layer for defining the lower insulating layer 2 is formed on the main surface of the semiconductor substrate 1. Then, the insulator material layer is etched thereby selectively forming a lower contact hole 31 to pass through the upper and lower surfaces. Thus, the lower insulating layer 2 is formed. Then, a polysilicon layer is formed to fill up the lower contact hole 31 and cover the lower insulating layer 2. The polysilicon layer is doped with an impurity. Thereafter etching or CMP, for example, is performed for retracting the upper surface of the polysilicon layer to be flush with the upper surface of the lower insulating layer 2, thereby forming the polysilicon plug 3 embedded in the lower contact hole 31.

In the next step shown in FIG. 23, a conductor material layer 74 of titanium nitride is first formed on the polysilicon plug 3 and the lower insulating layer 2. Thereafter resist patterns 82 are formed on a portion of the upper surface of the conductor material layer 74 located above the lower contact hole 31 and a portion separated therefrom.

In the next step shown in FIG. 24, the resist patterns 82 are employed as screens for executing etching, thereby patterning the conductor material layer 74. Consequently, the lower electrode film 6 connected with the polysilicon plug 3 and the conductor layer 14 separated from the lower electrode film 6 are formed. Subsequent steps are similar to those shown in FIGS. 12 to 14. However, TaOx is employed as the material for the dielectric film 8, and ruthenium is employed as the material for the upper electrode film 9.

TaOx is so employed as to simplify formation on the titanium nitride film forming the lower electrode film 6.

In a step of forming a ruthenium film for defining the upper electrode film 9, CVD is executed under a temperature of about 400° C., for example. In order to form a titanium nitride film by CVD, on the other hand, a high temperature of about 600° C. is necessary. Therefore, a ruthenium film formable at a relatively low temperature is preferable as a conductor film formed on the TaOx film for defining the dielectric film 8, due to its capability to suppress influence on the TaOx film.

As hereinabove described, the lower electrode film 6 and the conductor layer 14 are simultaneously formed through a single step, whereby the semiconductor device 102 can be readily manufactured. At the same time, the degree of freedom in a lower structure of the capacitor is advantageously improved.

Embodiment 3

Figure 25:
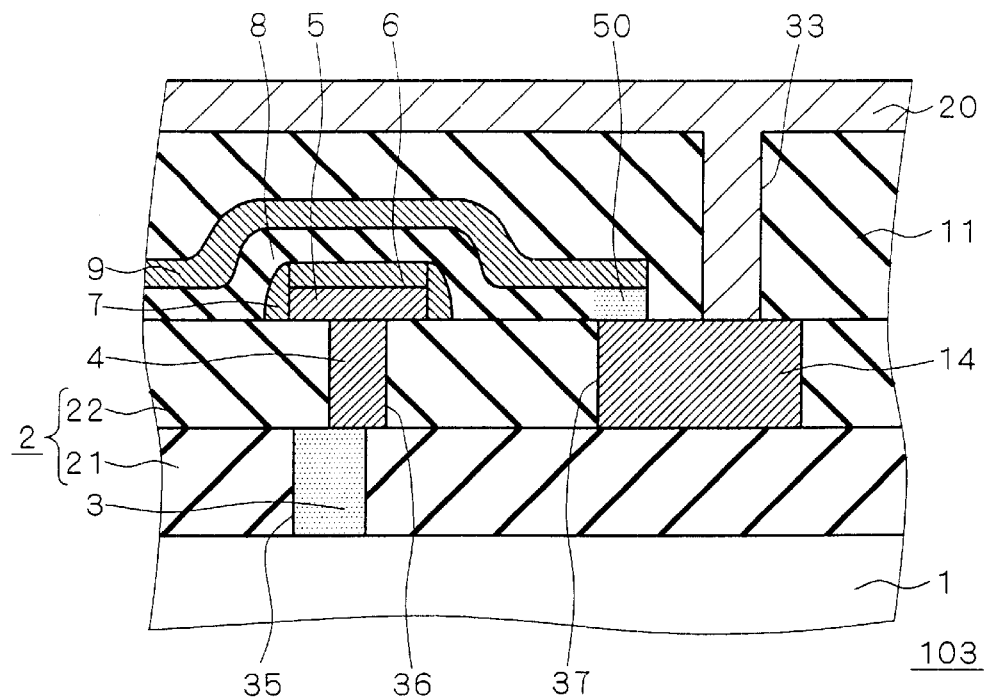
FIG. 25 is a longitudinal sectional view of a semiconductor device according to an embodiment 3 of the present invention.

FIG. 25 is a vertical sectional view partially showing a semiconductor device 103 according to an embodiment 3 of the present invention. This semiconductor device 103 is formed as a DRAM similarly to the semiconductor devices 101, 101a and 102, and FIG. 25 illustrates a capacitor of its memory cell and a peripheral portion thereof. The semiconductor device 103 is characteristically different from the semiconductor devices 101 and 101a in that titanium having reductivity with respect to a dielectric film 8 of BST is employed as the material for conductor layers 14 and 4 in place of titanium nitride and that the dielectric film 8 covers a part (referred to as a first portion) of the upper surface of the conductor layer 14 and is chemically converted to a conductor due to reductive action of the conductor layer in a portion 50 covering the first portion for electrically connecting an upper electrode film 9 and the conductor layer 14 with each other through the portion 50 converted to a conductor.

While a lower insulating layer 2 is identical in structure to that of the semiconductor device 101a in FIG. 25, this structure may alternatively be identical to that in the semiconductor device 101, as a matter of course. While no side wall 10 (FIG. 1) is provided in the semiconductor device 103 shown in FIG. 25, the side wall 10 may alternatively be provided.

Figure 26:
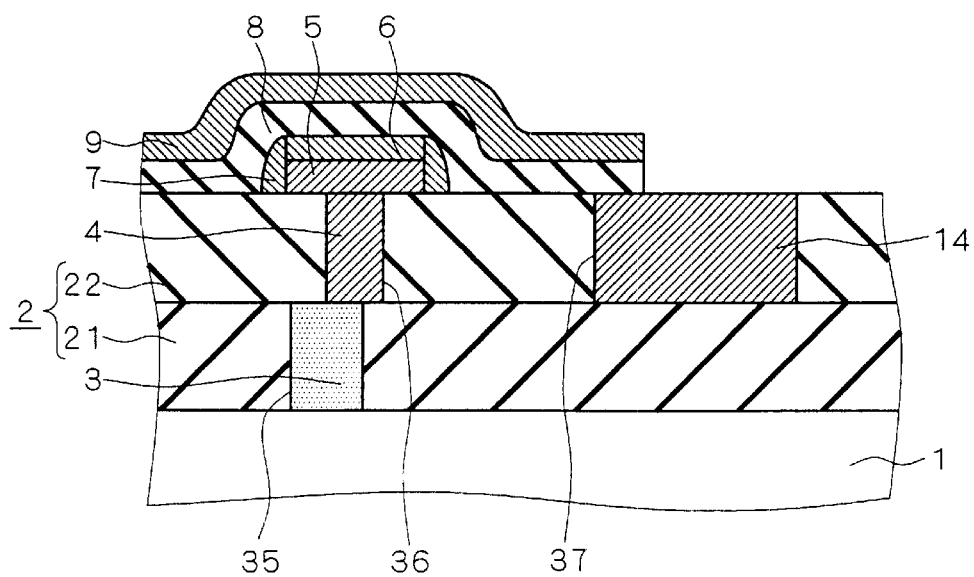

In order to manufacture the semiconductor device 103, steps shown in FIGS. 26 and 27 are carried out in place of those shown in FIGS. 13 and 14. In a step similar to that shown in FIG. 12 preceding the step shown in FIG. 26, a BST film 8A is formed to cover the conductor layer 14. When a lower electrode film 6 and a barrier metal layer 5 are thick, CVD is preferably employed for attaining excellent coverage. Whether sputtering or CVD is employed, heating is preferably performed within the range of about 400° C. to 500° C. During this process, titanium forming the conductor layer 14 reduces a portion of the BST film 8A covering the conductor layer 14, thereby converting the same to a conductor.

Figure 12:
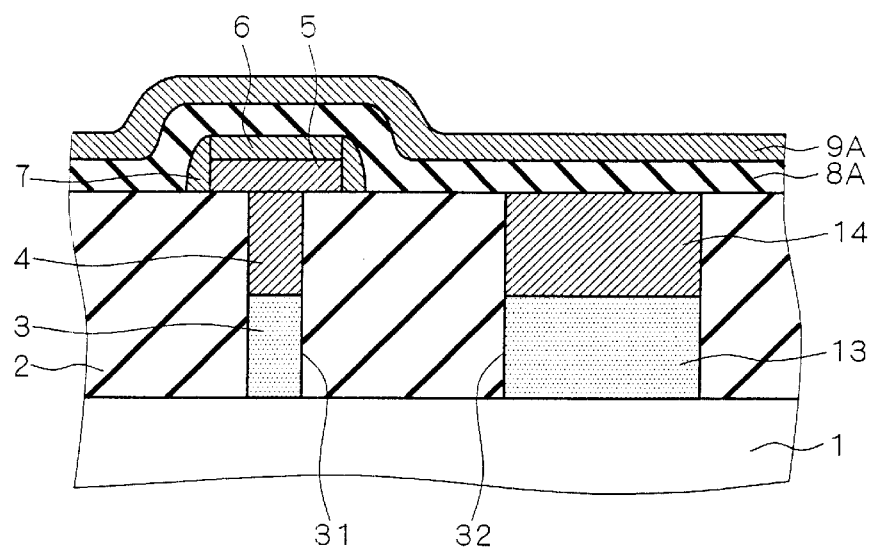

After the step similar to that shown in FIG. 12 has been performed, the BST film 8A and a platinum film 9A are patterned in the step shown in FIG. 26, thereby forming the dielectric film 8 covering the lower electrode film 6 and side walls 7 as well as the upper electrode film 9. This patterning is so performed that the dielectric film 8 and the upper electrode film 9 cover a part of the upper surface of the conductor layer 14.

If the BST film 8A is insufficiently converted to a conductor and electric resistance is high in the step similar to that shown in FIG. 12, a heat treatment step shown in FIG. 27 may be additionally carried out after the step shown in FIG. 26. In the step shown in FIG. 27, heat treatment is so performed as to further convert the portion 50 of the dielectric film 8 covering the conductor layer 14 to a conductor. Thus, the electric resistance of the portion 50 already converted to a conductor in the step similar to that shown in FIG. 12 is further reduced. The electric resistance of the portion 50 converted to a conductor can be adjusted in response to heat treatment conditions. When the BST film 8A is formed by sputtering in the step similar to that shown in FIG. 12, the sputtering can be performed at a temperature of about 200° C., and the BST film 8A is substantially not converted to a conductor in this case. At this time, the portion 50 of the dielectric film 8 can be converted to a conductor through the heat treatment step shown in FIG. 27.

After the step shown in FIG. 26 or 27 has been completed, the semiconductor device 103 can be obtained by carrying out a step similar to that performed after FIG. 14 for manufacturing the semiconductor device 101.

In the semiconductor device 103, as hereinabove described, the upper electrode film 9 and the conductor layer 14 are electrically connected with each other through the portion 50 of the dielectric film 8 converted to a conductor, whereby neither a mask pattern nor a transfer step therefor is required for electrically connecting the upper electrode film 9 and the conductor layer 14. Further, a step of forming the side wall 10 can be omitted.

Modifications.

While the noble metal employed for the lower electrode film 6 and the upper electrode film 9 is platinum or ruthenium in each of the embodiments 1 to 3, still another noble metal such as iridium, palladium or the like is also employable. These noble metals may be partially or entirely an oxide or a nitride to attain a corresponding effect, so far as the same has conductivity. Further, the material for the lower electrode film 6 and the upper electrode film 9 may not be a noble metal but a general conductor (not restricted to a metal either) is employable for attaining an effect of improving allowance for etching for forming the upper contact hole 33. While the semiconductor device 101, 101a, 102 or 103 is formed as a DRAM in each of the embodiments 1 to 3, the present invention is applicable to a general semiconductor device having a capacitor over a semiconductor substrate, such as an SRAM having a capacitor dielectric film formed by a ferroelectric film.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate having a main surface;
   an insulating layer formed on said main surface of said semiconductor substrate;
   a lower electrode film embedded in said insulating layer;
   a dielectric film embedded in said insulating layer and covering said lower electrode film;
   an upper electrode film embedded in said insulating layer and opposed to said lower electrode film through said dielectric film;
   a conductor plug electrically connecting said lower electrode film and said semiconductor substrate with each other through a lower contact hole selectively formed in said insulating layer;
   a conductor layer embedded in said insulating layer and electrically connected to said upper electrode film on a first portion defining a part of its upper surface; and
   a wire arranged on said insulating layer and connected to a second portion defining another part, different from said first portion, of said upper surface of said conductor layer through an upper contact hole selectively formed in said insulating layer.

2. The semiconductor device according to claim 1, wherein
   said conductor plug includes another conductor layer, and
   said another conductor layer and said conductor layer are identical in height to each other with reference to said main surface of said semiconductor substrate, identical in thickness to each other, and made of the same material.

3. The semiconductor device according to claim 1, wherein
   said lower electrode film and said conductor layer are identical in height to each other with reference to said main surface of said semiconductor substrate, identical in thickness to each other, and made of the same material.

4. The semiconductor device according to claim 1, further comprising a conductive side wall formed on a side wall surface of said upper electrode film and said dielectric film, wherein
   said side walls are connected to said first portion of said conductor layer.

5. The semiconductor device according to claim 1, wherein
   said dielectric film covers said first potion of said conductor layer and is chemically converted to a conductor in a portion covering said first portion, and
   said first portion of said conductor layer is electrically connected to said upper electrode film through said portion of said dielectric film converted to a conductor.

6. The semiconductor device according to claim 1, wherein
   material of said lower electrode film and said upper electrode film includes noble metal.

* * * * *